United States Patent
Ong et al.

(10) Patent No.: US 10,302,694 B2
(45) Date of Patent: May 28, 2019

(54) INTERPOSER BASED TEST PROGRAM EVALUATION

(71) Applicant: TEXAS INSTRUMENTS INCORPORATED, Dallas, TX (US)

(72) Inventors: Chee Peng Ong, Sunnyvale, CA (US); Hoon Siong Chia, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 331 days.

(21) Appl. No.: 15/391,535

(22) Filed: Dec. 27, 2016

(65) Prior Publication Data

US 2018/0180668 A1 Jun. 28, 2018

(51) Int. Cl.
*G01R 31/28* (2006.01)

(52) U.S. Cl.
CPC ..... *G01R 31/2884* (2013.01); *G01R 31/2834* (2013.01); *G01R 31/2889* (2013.01); *G01R 31/2896* (2013.01)

(58) Field of Classification Search
CPC ............ G01R 31/2884; G01R 31/2889; G01R 31/2896; G01R 31/2834

USPC ...................................... 324/754.18; 714/742
See application file for complete search history.

(56) References Cited

U.S. PATENT DOCUMENTS

2005/0229064 A1* 10/2005 Guidry ................. G01R 31/319
714/742

* cited by examiner

*Primary Examiner* — Farhana A Hoque
(74) *Attorney, Agent, or Firm* — Ronald O. Neerings; Charles A. Brill; Frank D. Cimino (57) ABSTRACT

One example includes a test system that includes a printed circuit board and a switching interposer board. The switching interposer board is comprised of a probe point, a first bus, a second bus, and a set of switches. Each switch includes a first terminal, a second terminal, and a third terminal, the first terminal being coupled to a respective pin of an integrated circuit device, the second terminal being coupled to the first bus, and the third terminal being coupled to the second bus. Each of the set of switches have a first state that selectively couples a pair of the pins of the integrated circuit device to each other through the first bus during a short test, and a second state that selectively couples at least one of the pins of the integrated circuit device to the probe point through the second bus during a voltage level spike test.

20 Claims, 5 Drawing Sheets

INTERPOSER BASED TEST PROGRAM EVALUATION

TECHNICAL FIELD

This disclosure relates generally to test systems, and more specifically to an interposed based test program evaluation.

BACKGROUND

Automatic test equipment or automated test equipment (ATE) are apparatus that perform tests on integrated circuit devices, known as the device under test (DUT), using automation to quickly perform measurements and evaluate the test results. An ATE can be a simple computer-controlled digital multimeter, or a complicated system containing dozens of complex test instruments (real or simulated electronic test equipment) capable of automatically testing and diagnosing faults in the integrated circuit devices. In some implementations, the ATE is coupled to an oscilloscope to allow a test technician to visually view results of the testing.

SUMMARY

One example includes a test system that includes a printed circuit board and a switching interposer board. The printed circuit board includes terminals coupled to input/output terminals of an automatic testing apparatus. The switching interposer board couples the terminals of the printed circuit board to an integrated circuit device, and is comprised of a probe point, a first bus, a second bus, and a set of switches. Each switch includes a first terminal, a second terminal, and a third terminal, the first terminal being coupled to a respective pin of the integrated circuit device, the second terminal being coupled to the first bus, and the third terminal being coupled to the second bus. Each of the set of switches have a first state that selectively couples a pair of the pins of the integrated circuit device to each other through the first bus during a short test evaluating a test program executed by the automatic testing apparatus, and a second state that selectively couples at least one of the pins of the integrated circuit device to the probe point through the second bus during a voltage level spike test evaluating a signal generated by the test program executed by the automatic testing apparatus.

Another example includes a test method. The test method includes coupling terminals of a printed circuit board to input/output terminals of an automatic testing apparatus. The test method further includes coupling, with a switching interposer board including a set of switches, the terminals of the printed circuit board to an integrated circuit device. The test method further includes coupling each switch, from a set of switches, to a respective pin of the integrated circuit device at a first terminal of the each switch, the first bus at a second terminal of the each switch, and the second bus at a third terminal of the each switch. The test method further includes selectively coupling, during a first state of the each switch, a selected pair of pins to one another through the first bus during a short test evaluating a test program executed by the automatic testing apparatus. The test method further includes selectively coupling, during a second state of the each switch, a selected pin of the integrated circuit device to a probe point of the switching interposer board through the second bus during a voltage level spike test evaluating a signal generated by the test program executed by the automatic testing apparatus.

Another example includes a test system. The test system includes a printed circuit board, a switching interposer board, first and second device contactors, and a manual actuator. The printed circuit board includes terminals coupled to input/output terminals of an automatic testing apparatus. The switching interposer board couples the terminals of the printed circuit board to an integrated circuit device, and is comprised of a probe point, a first bus, a second bus, and a set of switches. Each of the set of switches have a first state that selectively couples a pair of the pins of the integrated circuit device to each other through the first bus during a short test evaluating a test program executed by the automatic testing apparatus, and a second state that selectively couples at least one of the pins of the integrated circuit device to the probe point through the second bus during a voltage level spike test evaluating a signal generated by the test program executed by the automatic testing apparatus. The first and second device contactors couple the printed circuit board to the switching interposer and couple the interposer board to the integrated circuit device, respectively. The manual actuator manually mounts the integrated circuit device to the switching interposer.

DETAILED DESCRIPTION

In semiconductor integrated circuit testing, a test engineer develops test hardware and software tests for an automated testing equipment (ATE) apparatus. A test program instructs the ATE to provide stimulus and measurements at input/output pins to test the integrated circuit functionality as well as screens for assembly defect, for example, open (e.g., broken wire) or short (e.g., shorted wire) in the integrated circuit package. It is important to validate the test program before release to mass production to ensure effectiveness of the test program in performing functionality check, screening assembly opens or shorts in integrated circuits, as well as making sure that the test program does not induce anything that could potentially harm or destroy the device during testing.

There are two (2) major test program validations that are used along with a functional test before the test program is released to production. Short test effectiveness ensures that the test program is able to screen shorts between pins in the package. A voltage level spike check captures a voltage plot using an oscilloscope on each pin of the integrated circuit to ensure that test program voltage/power setting on each pin does not exceed an absolute maximum rating of the integrated circuit, the occurrence of which may potentially harm or destroy the integrated circuit. Typically in a test program evaluation, a technician uses a wire to short pins of the integrated circuit device under test. The technician shorts each pin of the integrated circuit device with every other pin of the integrated circuit device to test the behavior of the test program. Further, the technician connects a probe to each point of the integrated circuit device under test, moving from pin to pin. Such short and probe testing is extremely time consuming, typically requiring as much as approximately three (3) days to complete.

To overcome the time consuming test program evaluation discussed above, the examples include a switching interposer board that speeds such evaluation. Instead of the technician utilizing a wire to short two pins of the integrated circuit, the switching interposer board couples two pins of the integrated circuit to simulate a short circuit. Moreover, instead of the technician connecting a probe to each pin of the integrated circuit device under test, moving from pin to pin, the switching interposer board couples the pins under test to a probe point. A probe can remain coupled to this probe point to evaluate pin voltages of the integrated circuit under test, for example, during a power up or power cycle, or during test program execution.

In an example that includes the switching interposer board, a test system includes a printed circuit board that includes terminals couplable to input/output terminals of an ATE, and the switching interposer board that couples pins of an integrated circuit device to terminals of the printed circuit board. The switching interposer board also selectively couples pins of the integrated circuit device to one another to simulate a short to verify a shorts test, or alternatively a single pin to a probe point for pin signal measurement during a voltage level spike test. Further, the switching interposer board is comprised of a probe point, a first bus, a second bus, and a set of switches that can selectively couple pins of the integrated circuit board to one of a first bus and a second bus. The first bus is employed for a short test by coupling two different pins of the integrated circuit device to one another through the first bus. This coupling can be sequenced to test a single pin to each and every other pin on the integrated circuit for each of the pins. The second bus is employed to confirm a voltage level spike check by coupling a single pin to the probe point which can be probed by an oscilloscope to measure the response of the pin during a power cycle. The disclosed switching interposer board significantly speeds testing such shorts and voltage level spikes during test program evaluation, shortening testing by more than half, allowing such testing to be completed in approximately one (1) day to one and a half (1.5) days.

Figure 1:
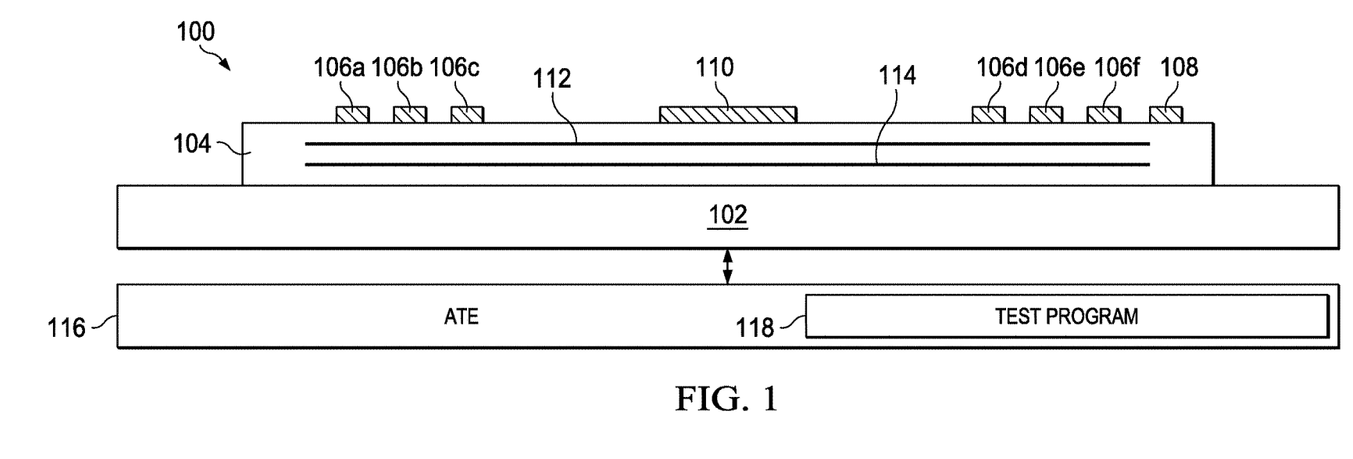
FIG. 1 illustrates an example of a test system.

FIG. 1 illustrates an example of a test system 100 for testing an integrated circuit device 110 under test. The test system 100 includes a printed circuit board (PCB) 102, a switching interposer board 104, an ATE 116, and a test program 118 executed by the ATE 116. In an example, the PCB 102 is an ATE load board. The integrated circuit device 110 may be a quad-flat no-lead (QFN) integrated circuit package that has, for example, 24, 36, 48, or any other number of pins that are possible with an integrated circuit package. The switching interposer board 104 may be used with any ATE platform or any device within a same QFN package family. Thus, one switching interposer board 104 can be used with each QFN package group. The switching interposer board 104 has no impact on the overall performance for production testing, with no impact on the PCB 102 signal integrity and no impact on the PCB 102 design.

The switching interposer board 104 includes a set or a plurality of switches 106a-f, a probe point 108, and first and second buses 112 and 114, respectively. In an example, the switches 106 may be slide switches. In another example, the switches 106 may be toggle switches, rocker switches, and any other switch 106 that selectively couples a common terminal to three other terminals of the switch 106. In an example, the buses 112 and 114 are disposed on a surface of the switching interposer board 104. In an alternate example, the buses 112 and 114 are disposed between layers of the switching interposer board 104.

The PCB 102 includes an electric coupling that allows the integrated circuit device 110 to be coupled to the PCB 102. A bottom side of the switching interposer board 104 includes this same electric coupling that allows the switching interposer board 104 to be coupled to the PCB 102 instead of the integrated circuit device 110. The top of the switching interposer board 104 includes this same electric coupling that allows the integrated circuit device 110 to be coupled to the switching interposer board 104 instead of the PCB 102.

The ATE 116 is coupled to the PCB 102, the PCB 102 including terminals that are coupled to input/output terminals of the ATE 116. The ATE 116 includes a test program 118 that generates test signals for evaluation the integrated circuit device 110. Moreover, the test program 118 monitors for short within the integrated circuit packet 110. When the test program 118 is being developed, the test program 118 is evaluated to assure that it is able to detect shorts within the integrated circuit package. Moreover, when the test program 118 executes, a technician evaluates the test program 118 to assure that the test program 118 does not instruct the ATE 116 to send signals to the integrated circuit device 110 that may damage the integrated circuit device 110. In an example, once the test program 118 detects a short or instructs the ATE 116 to send a signal that may damage the integrated circuit device 110, the test program 118 is reset and another test is executed to further evaluate the test program 118.

To facilitate determining if the test program 118 will detect a short on pins of the integrated circuit device 110, the switching interposer board 104 includes the plurality of switches 106a-f that couple pairs of pins of the integrated circuit device 110 together, via the first bus 112. To facilitate testing for voltage levels on pairs of pins of the integrated circuit device 110 during a short testing, the switching interposer board 104 includes the plurality of switches 106a-f to couple pairs of pins of the integrated circuit device 110 together, via the first bus 112. A voltage level measuring device, such as an oscilloscope or a multimeter may be coupled to the first bus 112 to measure voltage levels on the bus 112 during short testing. Additionally, to facilitate determining if the test program 118 does not instruct the ATE 116 to send signals to the integrated circuit device 110 that may damage the integrated circuit device 110, the switching interposer board 104 includes the plurality of switches 106a-f that couple individual pins of the integrated circuit device 110 to the probe point 108 via the second bus 114. A voltage level measuring device, such as an oscilloscope, may be coupled to the probe point 108 to visually identify voltage levels (for example, a voltage spike) on individual pins of the integrated circuit device 110 via the probe point 108.

The plurality of switches 106a-f are manually switched to a plurality of positions. The plurality of positions couple pins of the integrated circuit device 110 to one of the first bus 112 and the second bus 114, respectively. A first position of a first switch couples a particular pin of the integrated circuit device 110 to the first bus, while a first position of a second switch coupled another pin of the integrated circuit device 110 to the first bus 112 to essentially short the first pin to the second pin. Coupling pairs of pins of the integrated circuit device 110 via the first bus 112 allows for short testing. During such short testing of the first and second pins of the integrated circuit device 110, a resultant voltage level on first bus 112 should be approximately zero (0) volts. If the test program is operating properly, the test program will catch such short circuits to screen for shorts within the integrated circuit device 110 and catch faults within the integrated circuit device 110.

A second position of the plurality of switches 106a-f can be utilized to couple an individual pin of the integrated circuit device 110 to the probe point 108 via the second bus 114. Coupling an individual pin of the integrated circuit device 110 to the probe point 108 allows for testing of voltage levels being applied to that individual pin by the test program. Switching the plurality of switches 106a-f in sequential pairs to couple different pin pairs to the first bus 112 allows for short testing of each pin of the integrated circuit device 110 to every other pin of the integrated circuit device 110, two pins at a time over a period of time in which the integrated circuit device 110 is being tested. Alternatively, switching the plurality of switches 106a-f sequentially to couple individual pins to the second bus 114 allows for each of the individual pins of the integrated circuit device 110 to be coupled to the probe point 108, to test for voltage levels at the pins individually over a period of time in which the integrated circuit device 110 is being tested.

Figure 2:
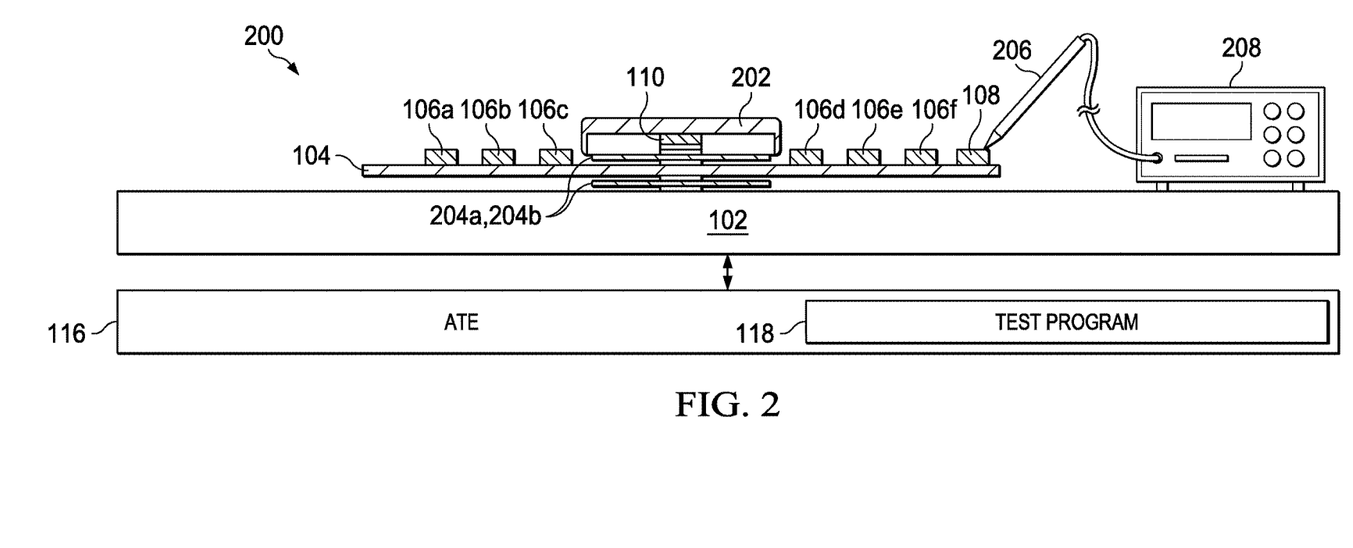
FIG. 2 illustrates another example test system.

FIG. 2 illustrates another example test system 200. The test system 200 further includes a manual actuator 202, first and second device contactors 204a and b, a probe 206, and an oscilloscope 208. The first device contactor 204a couples the integrated circuit device 110 and the switching interposer board 104. The second device contactor 204b couples the switching interposer board 104 and the PCB 102. The device contactor 204b is electrically coupled to the bottom of the switching interposer board 104 and the top of the PCB 102. Because the electrical contact points on the PCB 102 and the switching interposer board 104 are very close to the tops of such components, the first and second device contactors 204a and 204b act as spacers. Such spacing prevents the switching interposer board 104 from coming into contact with the PCB 102 and the manual actuator 202 coming into contact with the switching interposer board 104, such contacting potentially interfering with the operation of such components.

When the integrated circuit device 110 is placed into the manual actuator 202, the manual actuator 202 applies force to the integrated circuit device 110 to allow the integrated circuit device 110 to make temporary electrical contact with the switching interposer board 104, with the manual actuator 202 being electrically isolated from the switching interposer board 104. The manual actuator 202 may be hinged on one side of a cover of the manual actuator 202. Lowering the cover locks the integrated circuit device 110 onto electrical contacts of the manual actuator 202. Likewise, to remove the integrated circuit device 110, the cover is lifted which unlocks the integrated circuit device 110 from the manual actuator 202.

The probe 206 is placed into contact with the probe point 108 of the switching interposer board 104. The probe 206 provides an electrical path for signals from the switching interposer board 104 to be read by the oscilloscope 208. The oscilloscope 208 may capture a voltage plot on each pin of the integrated circuit device 110. The switches 106a-106f couple and decouple individual pins of the integrated circuit device 110 from the bus 114. Such coupling allows the oscilloscope 208, via the probe 206, to test for voltage levels on individual pins of the integrated circuit device 110 under test.

Figures 3A, 3B, 3C, 7:
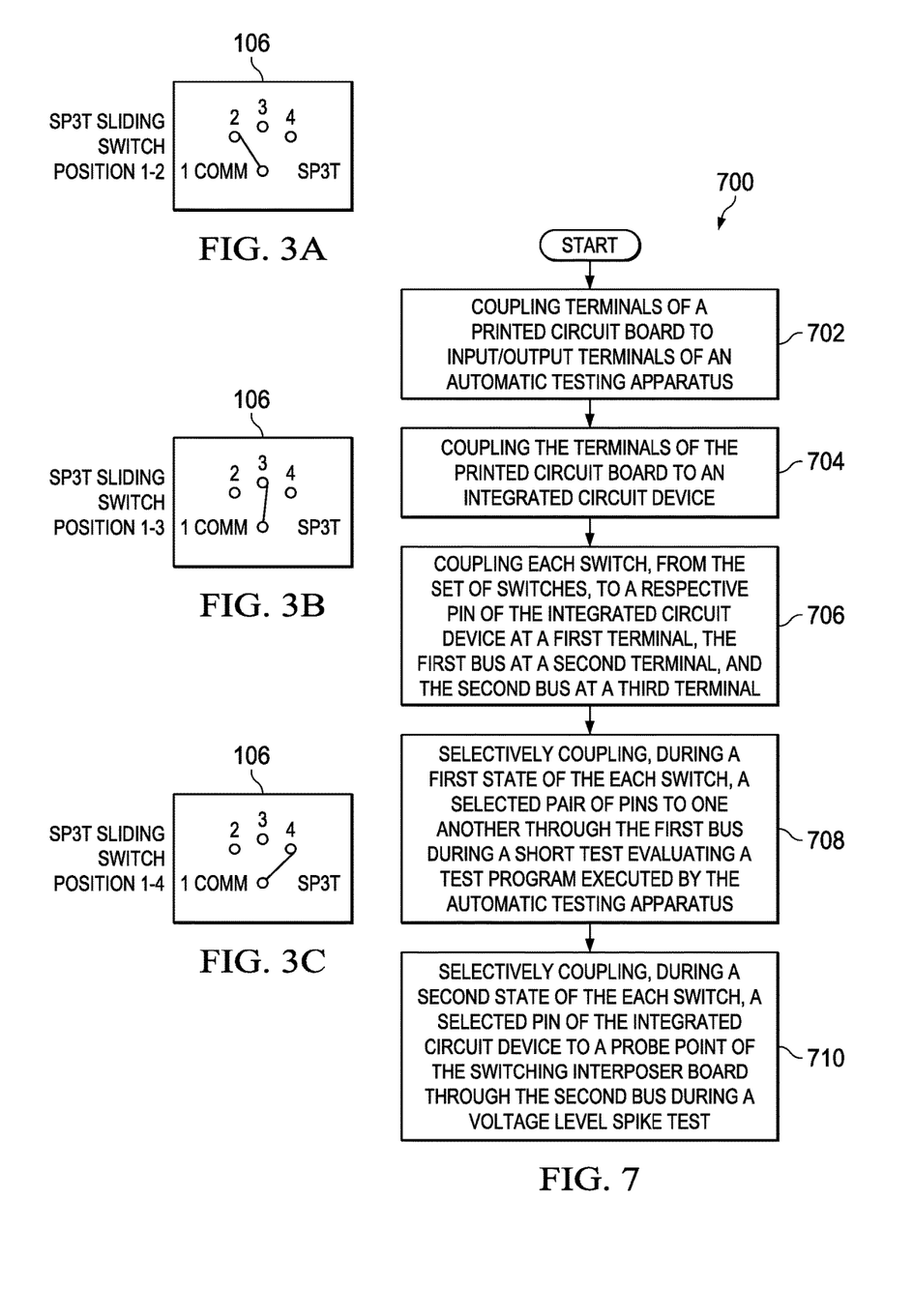
FIGS. 3A-C illustrate example switch positions for a switch used with a switching interposer board.
FIG. 7 illustrates a test method associated with the test system of FIG. 1.

FIG. 3A-C illustrate example switch positions for an example switch 106 used with the switching interposer board 104. The switch 106 may include three (3) positions. FIG. 3A illustrates a first position of the switch 106. In this first position, the switch 106 provides an electrical contact between a first terminal of the switch 106, terminal "1 COMM" and a second terminal of the switch, terminal "2". FIG. 3B illustrates a second position of the switch 106. In this second position, the switch 106 provides an electrical contact between the first terminal of the switch 106, terminal "1 COMM" and a third terminal of the switch, terminal "3". FIG. 3C illustrates a third position of the switch 106. In this third position, the switch 106 provides an electrical contact between the first terminal of the switch 106, terminal "1 COMM" and a fourth terminal of the switch, terminal "4". In an example, terminal "1 COMM" is coupled to individual pins of the integrated circuit device 110, terminal "2" is coupled to the bus 112, terminal "3" is a neutral position for the switch 106 decoupling the switch 106 from making any electrical contacts, and terminal "4" is coupled to the bus 114.

Figure 4:
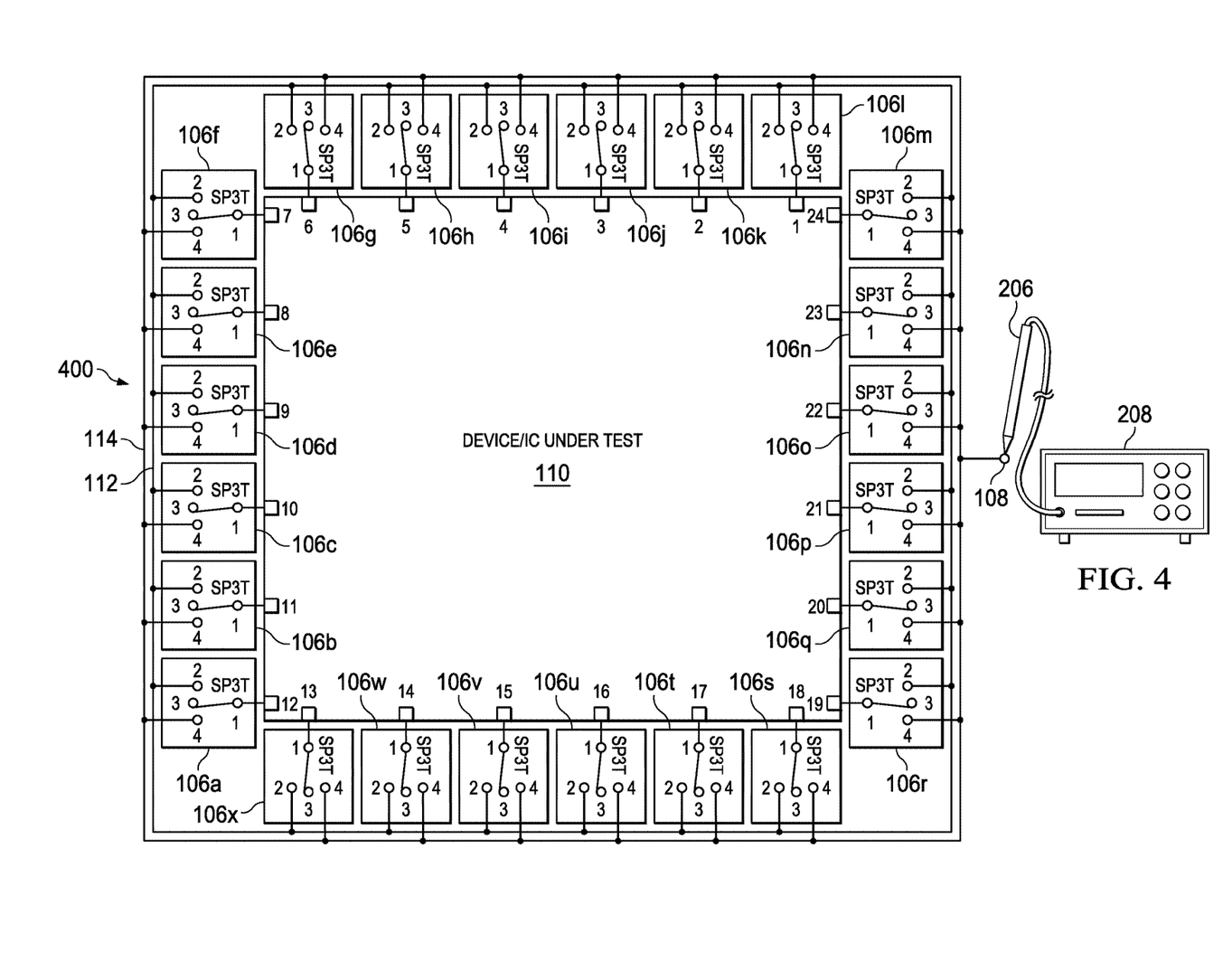
FIG. 4 illustrates another example of a test system.

FIG. 4 illustrates another example of a test system 400. In this example, the integrated circuit device 110 includes twenty-four (24) pins shown around the parameter of the integrated circuit pages 110. The integrated circuit device 110 includes six pins on each side thereof, spaced approximately equal distance therebetween. Coupled to each of these pins are individual switches 106, twenty-four (24) switches 106a-x. The terminal "1 COMM" from each of the individual switches 106a-x is illustrated as being coupled to individual pins 1-24 of the integrated circuit device 110. The first and second buses 112 and 114 encircle the integrated circuit device 110 and the switches 106a-x. Terminal "2" of each of the switches 106a-x is electrically coupled to the bus 112, which allows pins of the integrated circuit device 110 to be coupled to each other in pairs to execute short tests on the integrated circuit device 110 when pairs of pins are shorted. Terminal "3" illustrated as being a neutral position, electrically decoupling the switches 106a-x from making any electrical contacts. Terminal "4" of each of the switches 106a-x is electrically coupled to the bus 114 and individual pins of the integrated circuit device 110, which is also coupled to the probe point 108.

Figure 5:
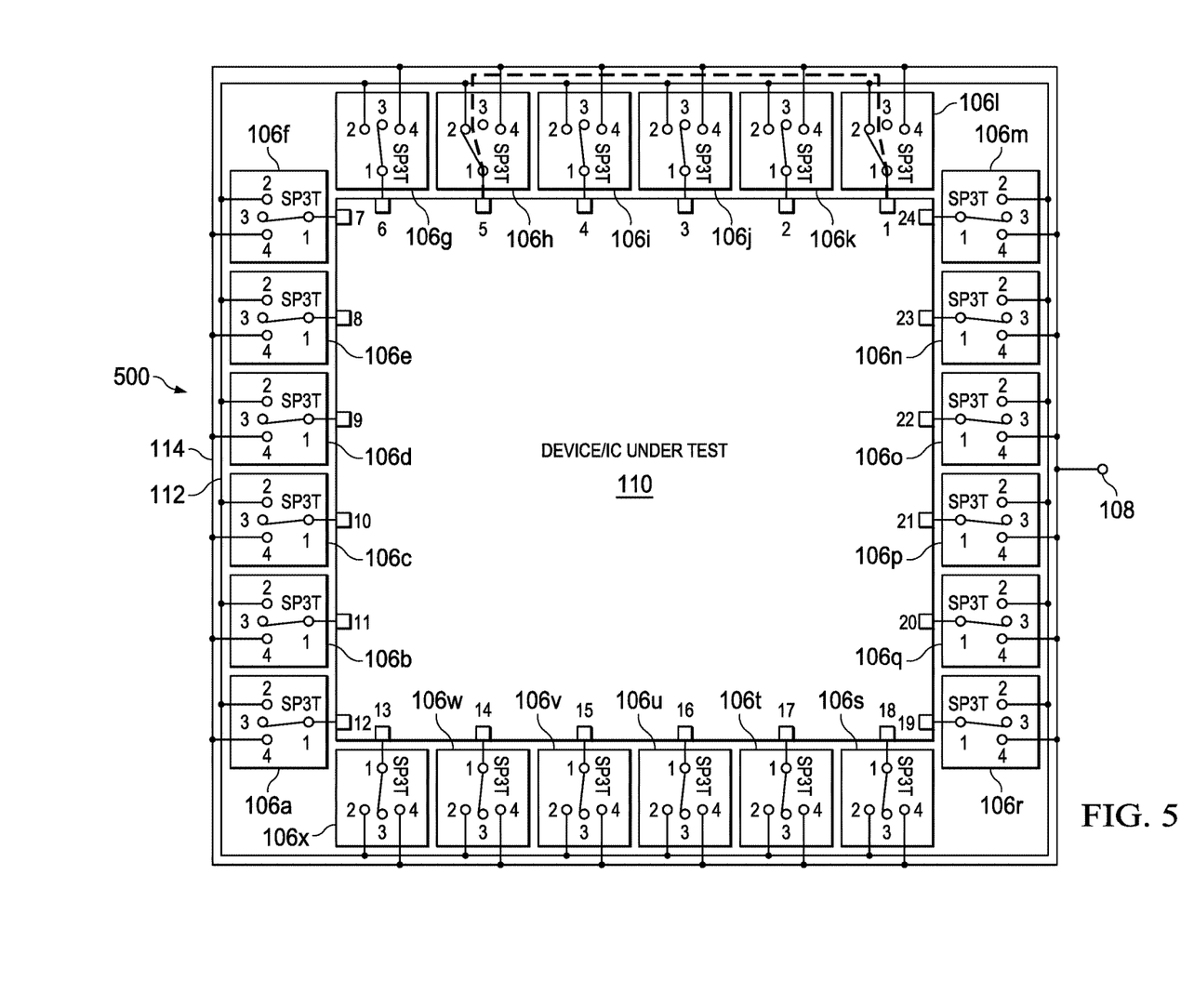
FIG. 5 illustrates an example test system configuration to short two pins of an integrated circuit package.

FIG. 5 illustrates an example test system configuration 500 to short two pins of the integrated circuit device 110. For example, to short pins 1 and 5 of the integrated circuit device 110, switch 106h is switched to couple terminal "1 COMM" and terminal "2" of the switch 106h. Such coupling couples pin 5 of the integrated circuit device 110 to the bus 112. Likewise, switch 106l is switched to couple terminal "1 COMM" and terminal "2". Such coupling couples pin 1 of the integrated circuit device 110 to the bus 112. Coupling pins 1 and 5 to the same bus 112 allows for short testing of the integrated circuit device 110 while shorting of pins 1 and 5 of the integrated circuit device 110. This process may be repeated to individually short each of the pins of the integrated circuit device 110 to individual other pins of the integrated circuit device 110 by similarly switching other switches 106 to couple their pins to the same bus 112.

Figure 6:
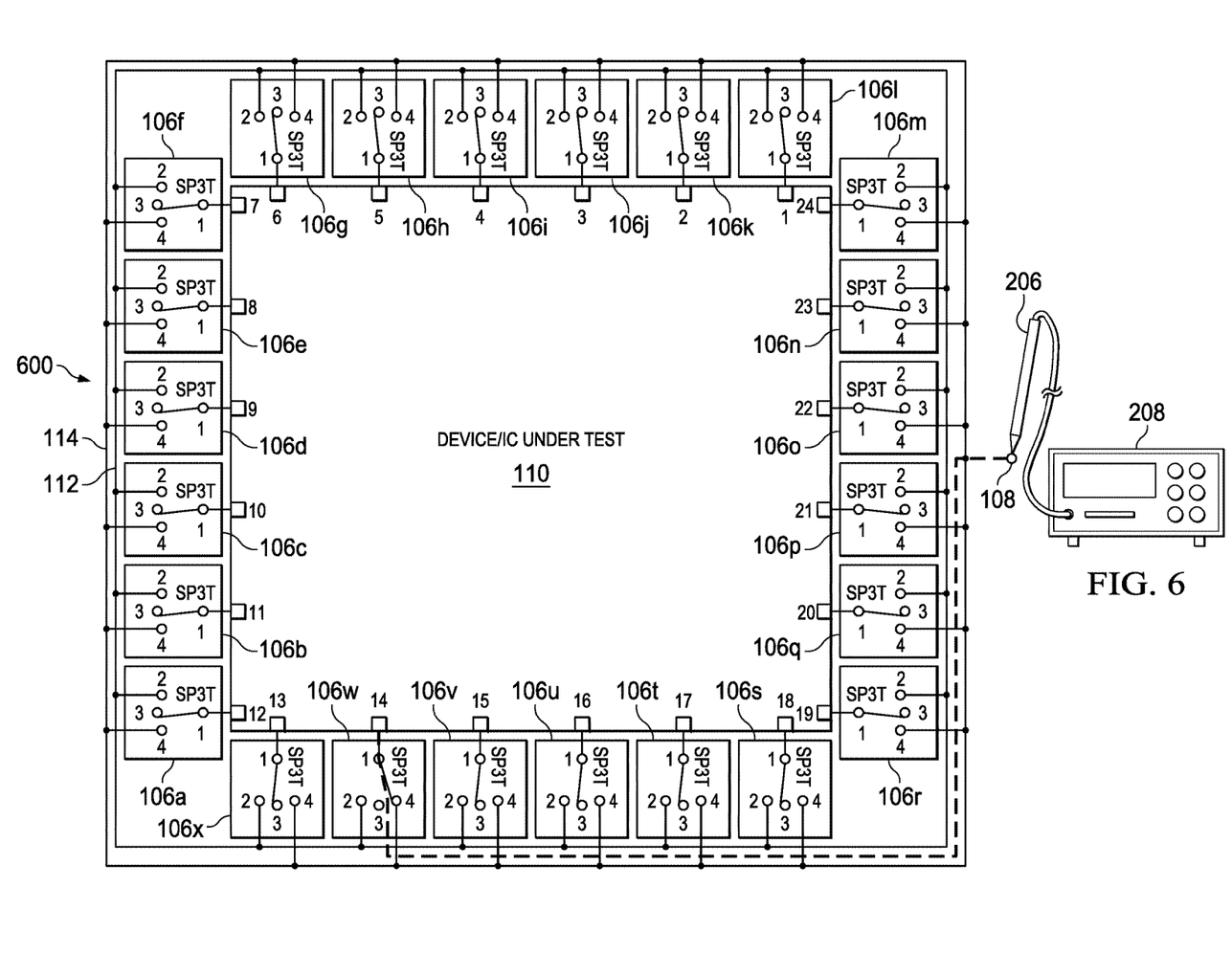
FIG. 6 illustrates an example test system configuration to test for voltage levels at a pin of the integrated circuit package.

FIG. 6 illustrates an example test system configuration 600 to test for voltage levels at a pin of the integrated circuit package. For example, to couple pin 14 of the integrated circuit device 110 to the probe point 108 for testing voltage levels at the pin 14, switch 106w is switched to couple terminal "1 COMM" and terminal "4" of the switch 106w. Such coupling couples pin 14 of the integrated circuit device 110 to the probe point 108. This process may be repeated to individually couple other pins of the integrated circuit device 110 to the probe point 108 to allow the oscilloscope 208 to monitor voltage levels at the individual pins of the integrated circuit device 110 during testing.

In view of the foregoing structural and functional features described above, a method in accordance with various aspects of the present disclosure will be better appreciated with reference to FIG. 7. While, for purposes of simplicity of explanation, the method of FIG. 7 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure. Moreover, for simplicity of explanation, the methods of FIG. 7 can include additional functional features not discussed, with FIG. 7 being described with reference to the examples illustrated herein.

FIG. 7 illustrates a test method 700 associated with the test system 100 of FIG. 1. At 702, terminals of the printed circuit board 102 are coupled to input/output terminals of the ATE 116. At 704, the terminals of the printed circuit board 102 are coupled to an integrated circuit device 110. Such coupling is performed by the switching interposer board 104 that includes the set of switches 106, a first bus 112 and a second bus 114.

At 706, each switch, from the set of switches 106, is coupled to a respective pin of the integrated circuit device 110 at a first terminal "3", the first bus 112 at a second terminal "3", and the second bus 114 at a third terminal "4". At 708, during a first state of the each switch 106, a selected pair of pins are selectively coupled to one another through the first bus 112 during a short test evaluating the test program 118 executed by the ATE 116.

At 710, during a second state of the each switch 106, a selected pin of the integrated circuit device 110 is selectively coupled to the probe point 108 of the switching interposer board 104 through the second bus 114 during a voltage level spike test evaluating a signal generated by the test program 118 executed by the ATE 116.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A test system, comprising:
    a printed circuit board that includes terminals coupled to input/output terminals of an automatic testing apparatus; and
    a switching interposer board that couples the terminals of the printed circuit board to an integrated circuit device, the switching interposer board comprising:
        a probe point;
        a first bus;
        a second bus; and
        a set of switches, each including a first terminal, a second terminal, and a third terminal, the first terminal is coupled to a respective pin of the integrated circuit device, the second terminal is coupled to the first bus, and the third terminal is coupled to the second bus, each of the set of switches having a first state that selectively couples a pair of the pins of the integrated circuit device to each other through the first bus during a short test evaluating a test program executed by the automatic testing apparatus, and a second state to selectively couple at least one of the pins of the integrated circuit device to the probe point through the second bus during a voltage level spike test evaluating a signal generated by the test program executed by the automatic testing apparatus.

2. The test system according to claim 1, wherein the set of switches each have a third state that selectively decouples a respective pin of the integrated circuit device from the first and second buses.

3. The test system according to claim 1, further comprising an oscilloscope that visually identifies voltage level spikes at the probe point during the voltage level spike test.

4. The test system according to claim 1, wherein the set of switches are single-pole three-throw switches each having the first state and the second state.

5. The test system according to claim 4, wherein the single pole three throw switches are slide switches.

6. The test system according to claim 1, further comprising a manual actuator that electrically couples the integrated circuit device to the switching interposer board during the short test evaluating the test program executed by the automatic testing apparatus and during the voltage level spike test evaluating the signal generated by the test program executed by the automatic testing apparatus.

7. The test system according to claim 1, wherein the integrated circuit device is a quad-flat no-lead (QFN) integrated circuit package.

8. The test system according to claim 7, wherein the QFN integrated circuit package is one of a 24, 36 and 48 pin QFN integrated circuit package.

9. A test method, comprising:
    coupling terminals of a printed circuit board to input/output terminals of an automatic testing apparatus;
    coupling, with a switching interposer board including a set of switches, the terminals of the printed circuit board to an integrated circuit device;
    coupling each switch, from the set of switches, to a respective pin of the integrated circuit device at a first terminal of the each switch, the first bus at a second terminal of the each switch, and the second bus at a third terminal of the each switch;
    selectively coupling, during a first state of the each switch, a selected pair of pins to one another through the first bus during a short test evaluating a test program executed by the automatic testing apparatus; and
    selectively coupling, during a second state of the each switch, a selected pin of the integrated circuit device to a probe point of the switching interposer board through the second bus during a voltage level spike test evaluating a signal generated by the test program executed by the automatic testing apparatus.

10. The test method according to claim 9, further comprising selectively decoupling, during a third state, a respective pin of the integrated circuit device from the first and second buses.

11. The test method according to claim 9, further comprising visually identifying with an oscilloscope voltage level spikes at the probe point during the voltage level spike test.

12. The test method according to claim 9, wherein the set of switches are single-pole three-throw switches each having the first state and the second state.

13. The test method according to claim 12, wherein the single pole three throw switches are slide switches.

14. The test method according to claim 9, further comprising electrically coupling, with a manual actuator, the integrated circuit device to the switching interposer board during the short test evaluating the test program executed by the automatic testing apparatus and during the voltage level spike test evaluating the test program executed by the automatic testing apparatus.

15. The test method according to claim 9, further comprising:
coupling, with a first device contactor, the printed circuit board and the switching interposer; and
coupling, with a second device contactor, the interposer board and the integrated circuit device under test.

16. The test method according to claim 9, wherein the integrated circuit device is a quad-flat no-lead (QFN) integrated circuit package.

17. A test system, comprising:
a printed circuit board that includes terminals coupled to input/output terminals of an automatic testing apparatus;
a switching interposer board that couples the terminals of the printed circuit board to an integrated circuit device, the switching interposer board comprising:
a probe point;
a first bus;
a second bus; and
a set of switches, each including a first terminal, a second terminal, and a third terminal, the first terminal is coupled to a respective pin of the integrated circuit device, the second terminal is coupled to the first bus, and the third terminal is coupled to the second bus, each of the set of switches having a first state that selectively couples a pair of the pins of the integrated circuit device to each other through the first bus during a short test evaluating a test program executed by the automatic testing apparatus, and a second state to selectively couple at least one of the pins of the integrated circuit device to the probe point through the second bus during a voltage level spike test evaluating a signal generated by the test program executed by the automatic testing apparatus;
a first and second device contactors that couple the printed circuit board to the switching interposer and that couple the interposer board to the integrated circuit device, respectively; and
a manual actuator to manually mount the integrated circuit device to the switching interposer.

18. The test system according to claim 17, wherein the set of switches are single-pole three-throw switches each having the first state and the second state.

19. The test system according to claim 17, further comprising an oscilloscope that visually identifies voltage level spikes at the probe point during the voltage level spike test.

20. The test system according to claim 17, wherein the integrated circuit device is a quad-flat no-lead (QFN) integrated circuit package.

* * * * *